US009197245B2

(12) United States Patent
Jeong et al.

(10) Patent No.: US 9,197,245 B2
(45) Date of Patent: Nov. 24, 2015

(54) DIGITAL SERIAL-TO-PARALLEL CONVERTER AND GAAS MMIC USING THE SAME

(71) Applicant: Electronics and Telecommunications Research Institute, Daejeon (KR)

(72) Inventors: Jin-Cheol Jeong, Daejeon (KR); Dong-Hwan Shin, Daejeon (KR); In-Kwon Ju, Daejeon (KR); In-Bok Yom, Daejeon (KR)

(73) Assignee: Electronics and Telecommunications Reearch Institute, Daejeon (KR)

( * ) Notice: Subject to any disclaimer, the term of this patent is extended or adjusted under 35 U.S.C. 154(b) by 0 days.

(21) Appl. No.: 14/515,112

(22) Filed: Oct. 15, 2014

(65) Prior Publication Data
US 2015/0145707 A1 May 28, 2015

(30) Foreign Application Priority Data

Nov. 26, 2013 (KR) ........................ 10-2013-0144678

(51) Int. Cl.
*H03M 9/00* (2006.01)
(52) U.S. Cl.
CPC ..................... *H03M 9/00* (2013.01)
(58) Field of Classification Search
CPC ........................................................ H03M 9/00
USPC ................................................ 341/100, 101
See application file for complete search history.

(56) References Cited

U.S. PATENT DOCUMENTS

| 5,699,002 | A | * | 12/1997 | Hayakawa | 327/202 |
| 6,150,965 | A | * | 11/2000 | Carr et al. | 341/101 |
| 7,218,683 | B2 |  | 5/2007 | Ko et al. |  |
| 7,253,754 | B2 | * | 8/2007 | Takeuchi et al. | 341/100 |
| 7,320,097 | B2 | * | 1/2008 | Ishiyama | 714/726 |

FOREIGN PATENT DOCUMENTS

KR   1019960044629 A   10/1996

OTHER PUBLICATIONS

Tony Nilsson et al., "Design of MMIC Serial to Parallel Converter in Gallium Arsenide," Thesis for Degree of Bachelor of Science in Engineering, Linköping University, 2001.

* cited by examiner

*Primary Examiner* — Brian Young
(74) *Attorney, Agent, or Firm* — William Park & Associates Ltd.

(57) ABSTRACT

A digital serial-to-parallel converter capable of minimizing a malfunction of a circuit by more stably performing an operation of a D flip flop in implementing a GaAs MMIC digital serial-to-parallel converter and a GaAs MMIC using the same are disclosed. The digital serial-to-parallel converter includes: a converter configured to convert a received clock signal, serial data, and load signal of TTL into a DCFL signal; a plurality of D flip flops configured to transmit the serial data received through the converter to a D flip flop of a next stage by the clock signal received through the converter and output the serial data of the D flip flop of the next stage by the load signal received through the converter; and a plurality of buffers configured to receive the serial data from the plurality of D flip flops to generate and output complementary signals.

11 Claims, 3 Drawing Sheets

DIGITAL SERIAL-TO-PARALLEL CONVERTER AND GAAS MMIC USING THE SAME

CROSS REFERENCE TO RELATED APPLICATION

This application claims the benefit of Korean Patent Application No. 10-2013-0144678, filed on Nov. 26, 2013, which is hereby incorporated by reference in its entirety into this application.

BACKGROUND OF THE INVENTION

1. Technical Field

The present invention relates to a digital serial-to-parallel converter and a GaAs MMIC using the same, and more particularly, to a digital serial-to-parallel converter which may be integrated within a MMIC for controlling an RF circuit of a GaAs MMIC having excellent RF characteristics at a high frequency and a GaAs MMIC using the same.

2. Description of the Related Art

A recent antenna system has been changed from a simple/passive antenna to a complex/active antenna. Therefore, a demand for an active phased array antenna system has been rapidly increased.

The active phased array antenna requires RF components which may digitally control a magnitude and a phase of a signal.

As the recent phased array antenna needs to be small/light/cheap, a demand for a multi-function chip (MFC) in which various functions may be implemented as a single chip has been increased.

The multi-function chip is implemented as a microwave monolithic integrated chip (MMIC) using a GaAs process having excellent RF characteristics at a high frequency. The MMIC includes a digital phase shifter, a digital attenuator, a transmitting and receiving switch, and the like. These components require a large number of control lines. Due to the control lines, a chip size of the MMIC is increased and much cost is required to assemble a module or a package.

A circuit to solve the above problems is a serial-to-parallel converter. The serial-to-parallel converter is a digital circuit which serves to convert one data incoming in series into a large number of parallel data. The serial-to-parallel converter is integrated within the MMIC having an RF circuit and thus a large number of RF circuits may be controlled through a single data line, such that an interface may be very simple.

Generally, the digital circuit including the serial-to-parallel converter is implemented using a CMOS process in terms of characteristics of a FET. When the serial-to-parallel converter is implemented using a CMOS, the serial-to-parallel converter may be integrated at a small size/low power. However, characteristics of the RF circuit to be implemented within the same chip may be very deteriorate, and therefore the multi-function chip is not generally implemented using the CMOS.

As the related art, Korean Patent Application Publication No. 1998-026261 (Serial-to-Parallel Converter Using Latch Circuit) discloses that a serial-to-parallel converter is configured of circuit devices having a smaller integrated area to occupy a smaller area than that of the case in which the serial-to-parallel converter is integrated within a semiconductor chip.

As a paper disclosing a detailed internal configuration of a serial-to-parallel converter using a GaAs process which is another related art, there is "Design of MMIC Serial to Parallel Converter in Gallium Arsenide" written by Tony Nilsson and Carl Samuelsson which is a Thesis for Degree of Bachelor of Science in Engineering, Linkoping University of Sweden, on November, 2001. In the thesis, the serial-to-parallel converter is driven by a bit block which is configured of a D flip flop and an output latch. The D flip flop is implemented using a memory cell latch circuit and a circuit is configured to output both of an input and an output as a complementary signal. The complementary signal is generated by a complementary signal generator which is configured of one inverter and two NOR gates. The D flip flop circuit requires two input data and outputs two output data and therefore increases the occurrence probability of malfunction due to a complicated interface. Further, since a GaAs high electron mobility transistor (GaAs HEMT) is more sensitive to noise than the CMOS, the error probability of the output data may be increased.

SUMMARY OF THE INVENTION

Accordingly, the present invention has been made keeping in mind the above problems occurring in the conventional art, and an object of the present invention is to provide a digital serial-to-parallel converter capable of minimizing a malfunction of a circuit by more stably performing an operation of a D flip flop in implementing a GaAs MMIC digital serial-to-parallel converter and a GaAs MMIC using the same.

In accordance with an aspect of the present invention, there is provided a digital serial-to-parallel converter, including: a converter configured to convert a received clock signal, serial data, and load signal of TTL into a DCFL signal; a plurality of D flip flops configured to transmit the serial data received through the converter to a D flip flop of a next stage by the clock signal received through the converter and output the serial data of the D flip flop of the next stage by the load signal received through the converter; and a plurality of buffers configured to receive the serial data from the plurality of D flip flops to generate and output complementary signals.

The plurality of D flip flops may be each operated by one input signal and one output signal.

The plurality of D flip flops may each include a plurality of 2-input NOR gates and one 3-input NOR gate.

The plurality of buffers may each include two inverters which are connected in series.

Any one of the two inverters may output an inverted data to the received data and the other thereof may output the same data as an original input data input to the corresponding buffer.

The plurality of buffers may output a control signal for controlling a digital phase shifter and a digital attenuator as the complementary signal.

The digital serial-to-parallel converter may further include: an output driver configured to generate a control signal for controlling a digital phase shifter and a digital attenuator based on the complementary signals from the plurality of buffers and transmit the generated control signal to a digital phase shifting and attenuating controller which controls the digital phase shifter and the digital attenuator.

The digital serial-to-parallel converter may further include: a third converter configured to convert an output signal of the output driver into a TTL signal to be output as an output monitor signal.

The digital serial-to-parallel converter may further include: a second converter configured to convert a switch signal input to the TTL into the DCFL signal; a buffer configured to receive the switch signal through the second converter to generate and output the complementary signal; and a second output driver configured to generate a control signal for controlling a transmitting and receiving switch based on the complementary signal from the buffer and transmit the generated control signal to a transmitting and receiving switch controller for controlling the transmitting and receiving switch.

In accordance with another aspect of the present invention, there is provided a GaAs MMIC, including: a digital serial-to-parallel converter including a first converter configured to convert a received clock signal, serial data, and load signal of TTL into a DCFL signal, a plurality of D flip flops configured to transmit the serial data received through the first converter to a D flip flop of a next stage by the clock signal received through the first converter and output the serial data of the D flip flop of the next stage by the load signal received through the first converter; and a plurality of buffers configured to receive the serial data from the plurality of D flip flops to generate and output complementary signals; a digital phase shifter configured to be operated according to a control signal based on the complementary signals from the plurality of buffers; and a digital attenuator configured to be operated according to a control signal based on the complementary signals from the plurality of buffers.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
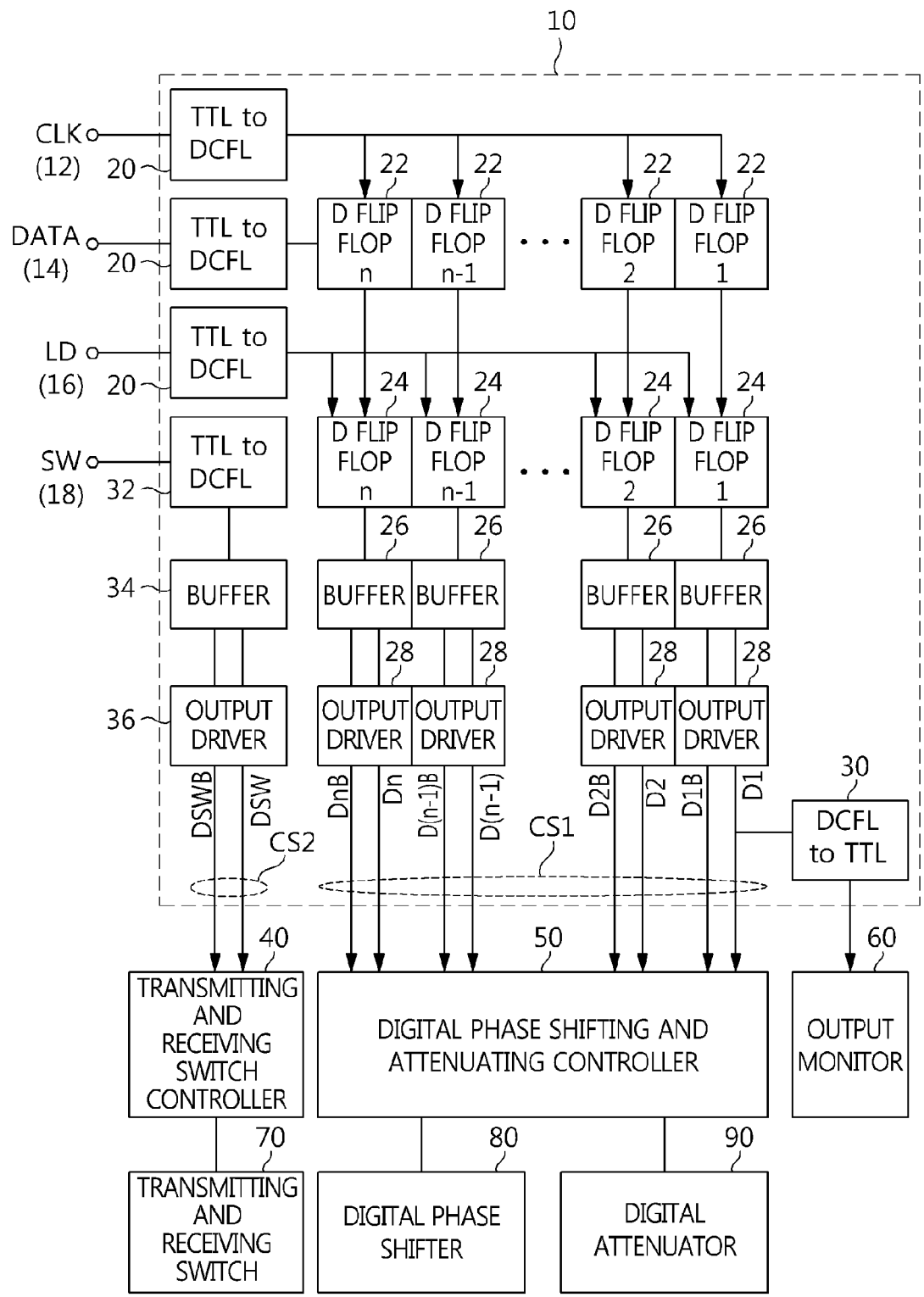
FIG. 1 is a diagram illustrating a configuration of a digital serial-to-parallel converter and a configuration of a GaAs MMIC according to an exemplary embodiment of the present invention.

Since the present invention may be variously modified and have several exemplary embodiments, specific exemplary embodiments will be shown in the accompanying drawings and be described in detail.

However, it is to be understood that the present invention is not limited to a specific exemplary embodiment, but includes all modifications, equivalents, and substitutions without departing from the scope and spirit of the present invention.

Terms used in the present specification are used only in order to describe specific exemplary embodiments rather than limiting the present invention. Singular forms are intended to include plural forms unless the context clearly indicates otherwise. It will be further understood that the terms "comprises" or "have" used in this specification, specify the presence of stated features, numerals, steps, operations, components, parts, or a combination thereof, but do not preclude the presence or addition of one or more other features, numerals, steps, operations, components, parts, or a combination thereof.

Unless indicated otherwise, it is to be understood that all the terms used in the specification including technical and scientific terms has the same meaning as those that are understood by those who skilled in the art. It must be understood that the terms defined by the dictionary are identical with the meanings within the context of the related art, and they should not be ideally or excessively formally defined unless the context clearly dictates otherwise.

Hereinafter, exemplary embodiments of the present invention will be described in more detail with reference to the accompanying drawings. In order to facilitate the general understanding of the present invention in describing the present invention, through the accompanying drawings, the same reference numerals will be used to describe the same components and an overlapped description of the same components will be omitted.

FIG. 1 is a diagram illustrating a configuration of a digital serial-to-parallel converter and a configuration of a GaAs MMIC according to an exemplary embodiment of the present invention.

To control a digital phase shifter 80, a digital attenuator 90, and a transmitting and receiving switch 70 which are included in a GaAs MMIC, a control signal D and an inverted signal DB thereto need to be simultaneously input to each configuration RF circuit. This is referred to as a complementary signal. Therefore, an output data of a digital serial-to-parallel converter 10 which is integrated in a GaAs MMIC needs to be output as the complementary signal.

As an input signal of the digital serial-to-parallel converter 10 illustrated in FIG. 1, there are a clock signal CLK 12, a serial data DATA 14, a load signal LD 16, and a switch signal SW 18. In this configuration, the clock signal 12 is a reference signal which moves the serial data 14 to D flip flops 22 and 24 disposed in parallel one by one. The serial data 14 is a data input to control the digital phase shifter 80 and the digital attenuator 90 which are included in a multi-function integrated circuit. The load signal 16 is a signal for outputting a parallel data. The switch signal 18 is an input signal for controlling the transmitting and receiving switch 70.

The four input signals 12, 14, 16, and 18 are transistor-transistor logic (TTL) signals which consist of a +5V signal corresponding to "on" and a signal configured of 0V corresponding to "off".

Meanwhile, in the case in which a GaAs HEMT device is operated as a switch, a switch is "on" when a gate voltage is 0V and the switch is "off" when the gate voltage is equal to or less than −1.2 V. Further, the digital serial-to-parallel converter 10 implemented using the GaAs HEMT is operated by the signals of 0V and −1.2V. The signal of the level is referred to as a direct coupled FET logic (DCFL).

The digital serial-to-parallel converter 10 illustrated in FIG. 1 includes a plurality of converters 20, 30, and 32, the plurality of D flip flops 22 and 24, a plurality of buffers 26 and 34, and a plurality of output drivers 28 and 36.

The converter 20 converts the received clock signal 12, serial data 14, and load signal 16 of a TTL level into the signal of the DCFL level. Preferably, the converter 20 is configured in three and any one of the converters 20 converts the clock signal 12 of the TTL level into the signal of the DCFL level. Another converter 20 converts the serial data 14 of the TTL level into the signal of the DCFL level. The remaining converter 20 converts the load signal 16 of the TTL level into the signal of the DCFL level.

The converter 30 converts an output signal (signal of the DCFL level) of the output driver 28 into the signal of the TTL level to be output as an output monitor signal.

The converter 32 converts the switch signal 18 input as the TTL level into the signal of the DCFL level.

In this configuration, the converter 20 may be a first converter which is disclosed in claims of the present invention, the converter 32 may be a second converter which is disclosed in claims of the present invention, and the converter 30 may be a third converter which is disclosed in claims of the present invention.

Meanwhile, in FIG. 1, the converters 20 and 32 are represented by TTL to DCFL and the converter 30 is represented by DCFL to TTL, which is to intuitively understand a function of the converters 20, 30, and 32.

The D flip flop 22 transmits the serial data 14 received through the converter 20 to the D flip flop 24 of a next stage by the clock signal 12 received through the converter 20. As the serial data 14 are disposed in all the D flip flops 24 of the corresponding stage, the D flip flops 24 output the serial data 14 to the corresponding buffers 26 by the load signals 16 received through the converter 20. For example, the serial data 14 output from the D flip flop 22 (for example, D flip flop 1 among the D flip flops 22) is transmitted to the D flip flop 24 (for example, D flip flop 1 among the D flip flops 24) of a next stage. By doing so, when the serial data 14 of all the D flip flops 22 are disposed in all the D flip flops 24 (that is, D flip flop 1 to D flip flop n), each D flip flop 24 transmits the serial data 14 to the corresponding buffers 26. In this configuration, the number of D flip flops 22 is equal to the number of D flip flops 24 and the D flip flops 22 and the D flip flops 24 are each connected to each other so as to correspond to each other one by one.

The buffer 26 receives the serial data from the D flip flop 24 and generates and outputs the complementary signal corresponding thereto. Here, the number of buffers 26 is equal to the number of D flip flops 24 and the buffers 26 and the D flip flops 24 are each connected to each other so as to correspond to each other one by one.

The buffer 34 receives the switch signal 18 converted into the signal of the DCFL level by the converter 32 and generates and outputs the complementary signal corresponding thereto.

The output driver 28 generates a control signal which may control the digital phase shifter 80 and the digital attenuator 90 based on the complementary signal from the buffers 26 and transmits the generated control signal to a digital phase shifting an attenuating controller 50 which controls the digital phase shifter 80 and the digital attenuator 90. In this configuration, the number of output drivers 28 is equal to the number of buffers 26 and the output drivers 28 and the buffers 26 are each connected to each other to correspond to each other one by one.

The output driver 36 generates a control signal which may control the transmitting and receiving switch 70 based on the complementary signal from the buffer 34 and transmits the generated control signal to a transmitting and receiving switch controller 40 which controls the transmitting and receiving switch 70.

When the output driver 28 illustrated in FIG. 1 is referred to as a first output driver, the output driver 36 may be referred to as a second output driver. Therefore, the output driver 36 may be the second output driver which is disclosed in claims of the present invention.

An operation of the digital serial-to-parallel converter 10 configured as described above will be described below.

The serial data 14 input to the D flip flop 22 is transmitted to the D flip flop 24 of a next stage by the clock signal 12.

When all the n serial data 14 moving one by one according to the clock signal 12 are disposed in each D flip flop 24, the load signals 16 are transmitted to the D flip flops 24.

The n serial data 14 are input to the n buffers 26 by the load signals 16.

The buffer 26 makes a signal deteriorating by noise into a clear signal and makes an original signal and a complementary signal which is an inverted signal. By the operation of the buffers 26, the complementary signal is output from each buffer 26 and becomes a control signal CS1 which may control the digital phase shifter 80 and the digital attenuator 90 which are included in the multi-function integrated circuit by the output driver 28. The control signal CS1 is transmitted to the digital phase shifter 80 and the digital attenuator 90 through the digital phase shifting and attenuating controller 50.

Since the voltage level of the DCFL voltage is 0V and −1.2V, it is difficult to control the digital phase shifter 80, the digital attenuator 90, and the transmitting and receiving switch 70 with the voltage level and capacity. Therefore, to certainly control the RF circuit, the output drivers 28 and 36 serve to convert the voltage level into 0V and −2.4V and provide driving capability which may perform a control regardless of a size of the HEMTs used in the digital attenuator 90, and the like. Therefore, to increase the driving capacity, the output drivers 28 and 36 are preferably implemented using the HEMT device having a relatively large size.

Meanwhile, the transmitting and receiving switch 70 is separately disposed from the digital serial-to-parallel converter 10 to be able to separately perform a control from the serial data. The switch signal 18 input as the TTL is converted into a DCFL signal suitable for a GaAs HEMT circuit by the converter 32, which is in turn input to the buffer 34. The buffer 34 generates the complementary signal while making the input signal into a signal without noise. The complementary signal from the buffer 34 becomes a control signal CS2 suitable for the operation of the transmitting and receiving switch 70 by the output driver 36. The control signal CS2 is transmitted to the transmitting and receiving switch 70 through the transmitting and receiving switch controller 40.

Further, it may be appreciated whether the operation of the digital serial-to-parallel converter 10 is normal based on the output monitor signal (that is, output signal from the converter 30). The output monitor signal requires a TTL signal, and therefore the converter 30 converts the DCFL signal configured of 0V and −2.4V into the TTL signal configured of +5V and 0V. The signal converted by the converter 30 is transmitted to the output monitor 60.

Meanwhile, the GaAs MMIC may include the digital serial-to-parallel converter 10, the transmitting and receiving switch controller 40, the digital phase shifting and attenuating controller 50, the transmitting and receiving switch 70, the digital phase shifter 80, and the digital attenuator 90 which are illustrated in FIG. 1.

The transmitting and receiving switch controller 40 receives the control signal CS2 from the output driver 36 to control the transmitting and receiving switch 70.

The digital phase shifting and attenuating controller 50 receives the control signal CS1 from the output driver 28 to control the digital phase shifter 80 and the digital attenuator 90.

Figure 2:
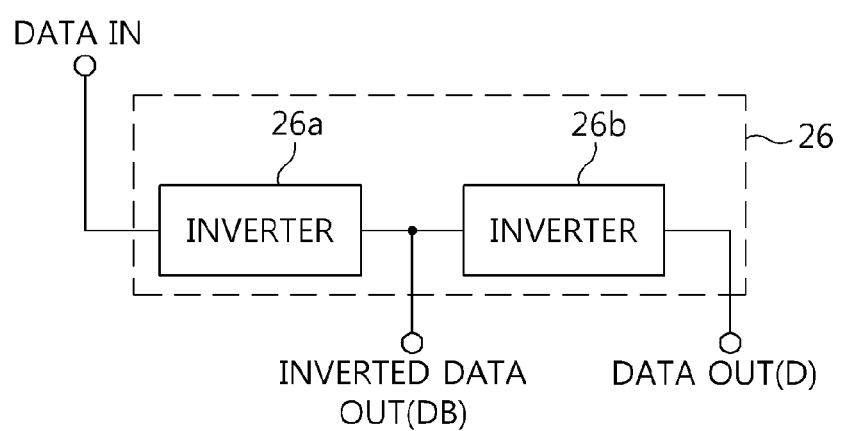
FIG. 2 is an internal configuration diagram of a buffer illustrated in FIG. 1.

FIG. 2 is an internal configuration diagram of the buffer illustrated in FIG. 1.

To control the digital phase shifter 80, the digital attenuator 90, and the transmitting and receiving switch 70 which are included in the multi-function chip (for example, GaAs MMIC), the control signal needs to be output as the complementary signal. The buffers 26 and 34 serve to make the complementary signal.

Each of the n buffers 26 within the digital serial-to-parallel converter 10 may be configured of two inverters 26*a* and 26*b* which are connected in series. FIG. 2 illustrates the internal configuration of the buffer 26, but an internal configuration of the buffer 34 may be allowed.

The serial data 14 output from the D flip flop 24 by the load signal 16 is input to the buffer 26 and passes through the two inverters 26a and 26b.

An output of the first inverter 26a is output as an inverted signal DB to the input serial data 14. The inverted signal DB is input to the output driver 28 which is a next block within the digital serial-to-parallel converter 10 and the corresponding output driver 28 generates the inverted control signal CS1 corresponding thereto. A signal passing through the second inverter 26b is again inverted and thus is output as a signal D which is the same as a signal 14 originally input to an input of the buffer. The signal D is also input to the output driver 28 which is the next block and the corresponding output driver 28 generates the control signal CS 1 corresponding thereto.

Therefore, the buffer 26 makes the original signal D and the complementary signal which is the inverted signal DB. The complementary signal passes through the inverter circuit and thus becomes a relatively clear signal without noise.

Figure 3:
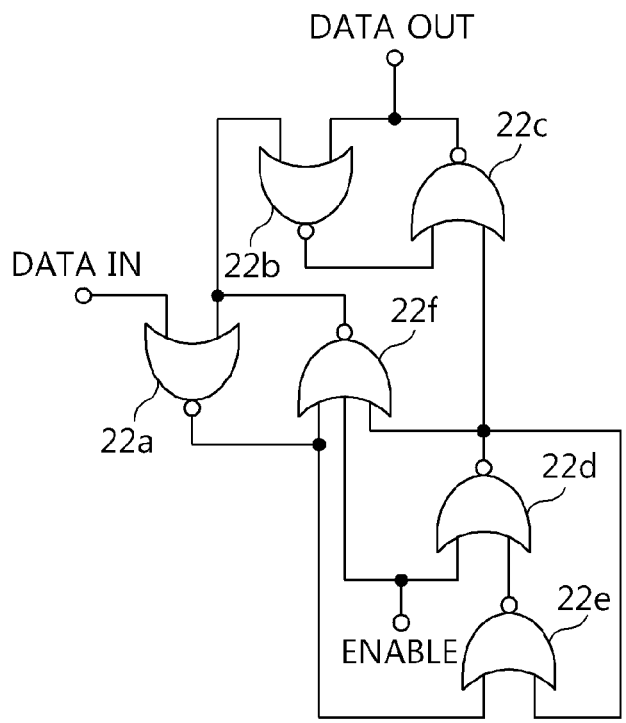
FIG. 3 is an internal configuration diagram of a D flip flop illustrated in FIG. 1.

FIG. 3 is an internal configuration diagram of the D flip flop illustrated in FIG. 1.

Unlike the general D flip flop, the D flip flop according to the exemplary embodiment of the present invention has a relatively simple structure which is operated by one input signal and one output signal. The structure may minimize the malfunction of the circuit.

In FIG. 3, the D flip flop 22 is configured of five 2-input NOR gates 22a, 22b, 22c, 22d, and 22e and one 3-input NOR gate 22f.

One input terminal of the NOR gate 22a receives an input data Data In and another input terminal of the NOR gate 22a is connected to one input terminal of the NOR gate 22b and an output terminal of the NOR gate 22f. The output terminal of the NOR gate 22a is connected to one input terminal of the NOR gate 22f and one input terminal of the NOR gate 22e.

Another input terminal of the NOR gate 22b is connected to an output terminal (that is, terminal outputting an output data (Data Out)) of the corresponding D flip flop along with an output terminal of the NOR gate 22c and an output terminal of the NOR gate 22b is connected to one input terminal of the NOR gate 22c.

Another input terminal of the NOR gate 22c is connected to an output terminal of the NOR gate 22d and is connected to another input terminal of the NOR gate 22e and another input terminal of the NOR gate 22f.

One input terminal of the NOR gate 22d receives an enable signal along with another input terminal of the NOR gate 22f and another input terminal of the NOR gate 22d is connected to an output terminal of the NOR gate 22e.

The input data (Data In) is output as the output data (Data Out) by the enable signal.

The data 14 through the converter 20 of FIG. 1 becomes the input data (Data In) of the D flip flop 22 which is at an upper line in FIG. 1 and the output data (Data Out) of the D flip flop 22 is handed over to the D flip flop 24 of the adjacent next stage.

The enable signal is operated by the clock signal 12 of FIG. 1. Therefore, in the D flip flop 24 which is positioned at a second line, the input data (Data In) is a signal output in parallel from the n D flip flops 22 positioned at the upper line and the output data (Data Out) of the D flip flop 24 is input to the buffer 26 of a lower line. In this case, the enable signal is operated by the load signal 16 of FIG. 1.

As such, a method for making complementary data for each parallel data according to an exemplary embodiment of the present invention is implemented using the buffer. The buffer implemented by connecting the two inverters in series makes output ports in the outputs of each inverter to form the two output data into accurately inverted data, thereby making the complementary data. Further, the buffer additionally performs a function of removing the noise of the circuit to make clear data and thus is contributed to the more stable operation of the digital serial-to-parallel converter. Since the buffer makes the complementary data, the D flip flop may integrally operate the input data and the output data, respectively. Therefore, the D flip flop according to the exemplary embodiment of the present invention is more stably operated, thereby minimizing the malfunction of the circuit.

In accordance with the present invention having the above configuration, the digital serial-to-parallel converter implemented using the CMOS may be implemented as the GaAs MMIC.

In particular, the complicated D flip flop operated by the existing complementary signal is not used but the simple D flip flop, each of which has one input and one output, may be used, the complementary signal required to control the digital phase shifter, the digital attenuator, and the transmitting and receiving switch which are included in the multi-function chip (GaAs MMIC) may be simply generated by the buffer stage, and the noise may be removed by the buffer, thereby implementing the more stable digital serial-to-parallel converter.

The optimal exemplary embodiments are disclosed above in the drawings and the specification. Herein, specific terms have been used, but are just used for the purpose of describing the present invention and are not used for qualifying the meaning or limiting the scope of the present invention, which is disclosed in the appended claims. Therefore, it will be appreciated to those skilled in the art that various modifications are made and other equivalent embodiments are available. Accordingly, the actual technical protection scope of the present invention must be determined by the spirit of the appended claims.

What is claimed is:

1. A digital serial-to-parallel converter, comprising:
a converter configured to convert a received clock signal, serial data, and load signal of TTL into a DCFL signal;
a plurality of D flip flops configured to transmit the serial data received through the converter to a D flip flop of a next stage by the clock signal received through the converter and output the serial data of the D flip flop of the next stage by the load signal received through the converter; and
a plurality of buffers configured to receive the serial data from the plurality of D flip flops to generate and output complementary signals,
wherein the plurality of D flip flops each include a plurality of 2-input NOR gates and one 3-input NOR gate.

2. The digital serial-to-parallel converter of claim 1, wherein the plurality of D flip flops are each operated by one input signal and one output signal.

3. The digital serial-to-parallel converter of claim 1, wherein the plurality of buffers each include two inverters which are connected in series.

4. The digital serial-to-parallel converter of claim 3, wherein any one of the two inverters outputs an inverted data to the received data and the other thereof outputs the same data as an original input data input to the corresponding buffer.

5. The digital serial-to-parallel converter of claim 1, wherein the plurality of buffers output a control signal for controlling a digital phase shifter and a digital attenuator as the complementary signal.

6. The digital serial-to-parallel converter of claim 1, further comprising:

an output driver configured to generate a control signal for controlling a digital phase shifter and a digital attenuator based on the complementary signals from the plurality of buffers and transmit the generated control signal to a digital phase shifting and attenuating controller which controls the digital phase shifter and the digital attenuator.

7. The digital serial-to-parallel converter of claim 6, further comprising:
   a third converter configured to convert an output signal of the output driver into a TTL signal to be output as an output monitor signal.

8. The digital serial-to-parallel converter of claim 1, further comprising:
   a second converter configured to convert a switch signal input to the TTL into the DCFL signal;
   a buffer configured to receive the switch signal through the second converter to generate and output the complementary signal; and
   a second output driver configured to generate a control signal for controlling a transmitting and receiving switch based on the complementary signal from the buffer and transmit the generated control signal to a transmitting and receiving switch controller for controlling the transmitting and receiving switch.

9. A GaAs MMIC, comprising:
   a digital serial-to-parallel converter including a first converter configured to convert a received clock signal, serial data, and load signal of TTL into a DCFL signal, a plurality of D flip flops configured to transmit the serial data received through the first converter to a D flip flop of a next stage by the clock signal received through the first converter and output the serial data of the D flip flop of the next stage by the load signal received through the first converter; and a plurality of buffers configured to receive the serial data from the plurality of D flip flops to generate and output complementary signals;
   a digital phase shifter configured to be operated according to a control signal based on the complementary signals from the plurality of buffers; and
   a digital attenuator configured to be operated according to a control signal based on the complementary signals from the plurality of buffers.

10. The GaAs MMIC of claim 9, wherein the digital serial-to-parallel converter further includes:
    a second converter configured to convert a switch signal input to the TTL into the DCFL signal; and
    a buffer configured to receive the switch signal through the second converter to generate and output the complementary signal.

11. The GaAs MMIC of claim 10, further comprising:
    a transmitting and receiving switch configured to be operated according to a control signal based on the complementary signal from the buffer.

* * * * *